United States Patent
Kaida et al.

(10) Patent No.: US 8,453,526 B2
(45) Date of Patent: Jun. 4, 2013

(54) METHOD OF INSPECTING MOUNT STATE OF COMPONENT

(75) Inventors: Kenichi Kaida, Fukuoka (JP); Noboru Higashi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 425 days.

(21) Appl. No.: 12/599,593

(22) PCT Filed: Jul. 18, 2008

(86) PCT No.: PCT/JP2008/063454
§ 371 (c)(1),
(2), (4) Date: Nov. 10, 2009

(87) PCT Pub. No.: WO2009/014223
PCT Pub. Date: Jan. 29, 2009

(65) Prior Publication Data
US 2010/0224014 A1 Sep. 9, 2010

(30) Foreign Application Priority Data
Jul. 20, 2007 (JP) ................ P2007-189005

(51) Int. Cl.
*G01D 3/08* (2006.01)
(52) U.S. Cl.
USPC ........................................................ 73/865.8
(58) Field of Classification Search
USPC ........................................................ 73/865.8
See application file for complete search history.

(56) References Cited

U.S. PATENT DOCUMENTS
2001/0025413 A1  10/2001  Asai et al.

FOREIGN PATENT DOCUMENTS
| EP | 1 578 186 A2 | 9/2005 |
| JP | 10-224099 A | 8/1998 |
| JP | 11-298200 A | 10/1999 |
| JP | 2002-271099 A | 9/2009 |

OTHER PUBLICATIONS
International Search Report for PCT/JP2008/063454, Feb. 17, 2009.

*Primary Examiner* — Hezron E Williams
*Assistant Examiner* — Paul West
(74) *Attorney, Agent, or Firm* — Pearne & Gordon LLP

(57) ABSTRACT

A mount state of components is inspected in a mounting apparatus 1*b* at total two divisions of a component mounting division b where the mounting apparatus 1*b* performs mounting and a component mounting division a where a mounting apparatus 1*a* disposed on an upstream side performs the mounting; the mount state of components is inspected in a mounting apparatus 1*c* at total three divisions of a component mounting division c where the mounting apparatus 1*c* performs the mounting and the component mounting divisions a and b where the mounting apparatus 1*a* and 1*b* disposed on the upstream side perform the mounting; and the mount state of components is inspected in a mounting apparatus 1*d* at total four divisions of a component mounting division d where the mounting apparatus 1*d* performs the mounting and the component mounting divisions a, b, and c where the mounting apparatus 1*a*, 1*b*, and 1*c* disposed on the upstream side perform the mounting. In this way, since a step in which abnormal mounting occurs can be easily specified and an effective solution can be established at a predetermined location or item, the abnormality can be easily solved.

8 Claims, 3 Drawing Sheets

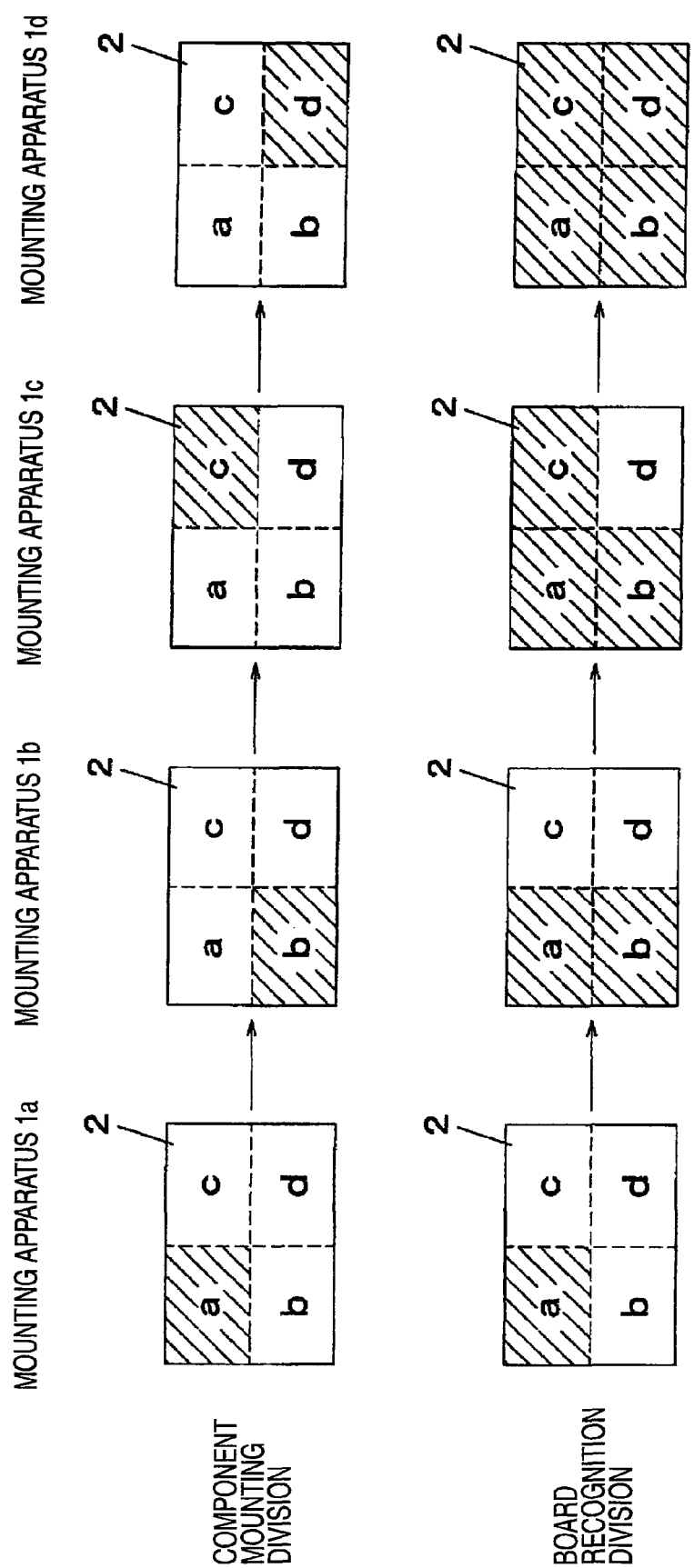

METHOD OF INSPECTING MOUNT STATE OF COMPONENT

TECHNICAL FIELD

The present invention relates to a method of inspecting a mount state of components mounted on a board.

BACKGROUND ART

A system in which one board is conveyed from an upstream side to a downstream side via plural mounting device and components are mounted by the mounting apparatuses step by step has been widely used in a production factory to manufacture electric devices or the like. When mounting the components on the board conveyed via the mounting apparatus is completed, a mount state of the components is inspected before the board is carried out. In the inspecting process, the component is discriminated between a normal mount state in which components are accurately mounted with a predetermined posture at a predetermined location, and an abnormal mount state in which components are not mounted at the predetermined location or components are mounted with an abnormal posture. As a method of discriminating between these mount states, there is known a method of picking up previous and next images at a location where the component is mounted on a board, and comparing each data of the images to each other to inspect the mount state of the component (See Patent Document 1).

[Patent Document 1] JP-A-2002-271099

DISCLOSURE OF THE INVENTION

Technical Problem

In a mounting system including plural mounting apparatuses, the above discriminating method can be applied in carry-in or carry-out of a board to inspect the abnormal mount state. However, the method cannot specify the step in which a cause of the abnormal mounting occurs. That is, the mounting apparatus having mounted the component which is the cause of the abnormal mounting can be specified by checking a mounting history record of the mounting apparatus. However, when the component which has been normally mounted in the mounting is detached, damaged, or displaced due to various operations on other components by the mounting apparatus disposed on the downstream, the cause of the abnormal mounting may not be specified. If the mounting apparatus for performing the operations which are the cause of the abnormal mounting is specified, it is easy to seek a solution to the cause. Accordingly, it is possible to effectively reduce occurrence of the abnormal mounting.

An object of the invention is to provide a method of inspecting a mount state of components to establish a solution to a cause of abnormal mounting in a mounting system including plural mounting apparatus.

Technical Solution

According to Aspect 1 of the invention, there is provided a method of inspecting a mount state of components mounted by mounting apparatus on a board which is conveyed from an upstream side to a downstream side via a plurality of the mounting apparatus.

The method includes: inspecting the mount state of the component at a location where the component is mounted by each mounting apparatus in each mounting apparatus; and inspecting the mount state of the component at the location where the component has been mounted by each mounting apparatus disposed on the upstream side in each mounting apparatus disposed on the downstream side.

Aspect 2 of the invention described in Aspect 1 provides the method further including inspecting the mount state of the component at a location adjacent to the location where the component is mounted by each mounting apparatus disposed on the downstream side, among the locations where the components have been mounted by the mounting apparatus disposed on the upstream side.

Aspect 3 of the invention described in Aspect 1 or 2 provides the method further including inspecting the mount state of the component at a predetermined location among the locations where the components have been mounted by the mounting apparatus disposed on the upstream side in each mounting apparatus disposed on the downstream side.

Advantageous Effects

According to the invention, it is easy to specify s step in which the abnormal mounting occurs in a mounting system. Accordingly, when a cause of the abnormal mounting in production is solved, an effective solution to the cause of the abnormal mounting can be established in not the entire system but the specified step in production.

BRIEF DESCRIPTION OF THE DRAWINGS

FIG. 3 is a top view illustrating a relationship between a component mounting location and a board recognition location in each mounting apparatus according to the embodiment of the invention.

BEST MODE FOR CARRYING OUT THE INVENTION

Figure 1:
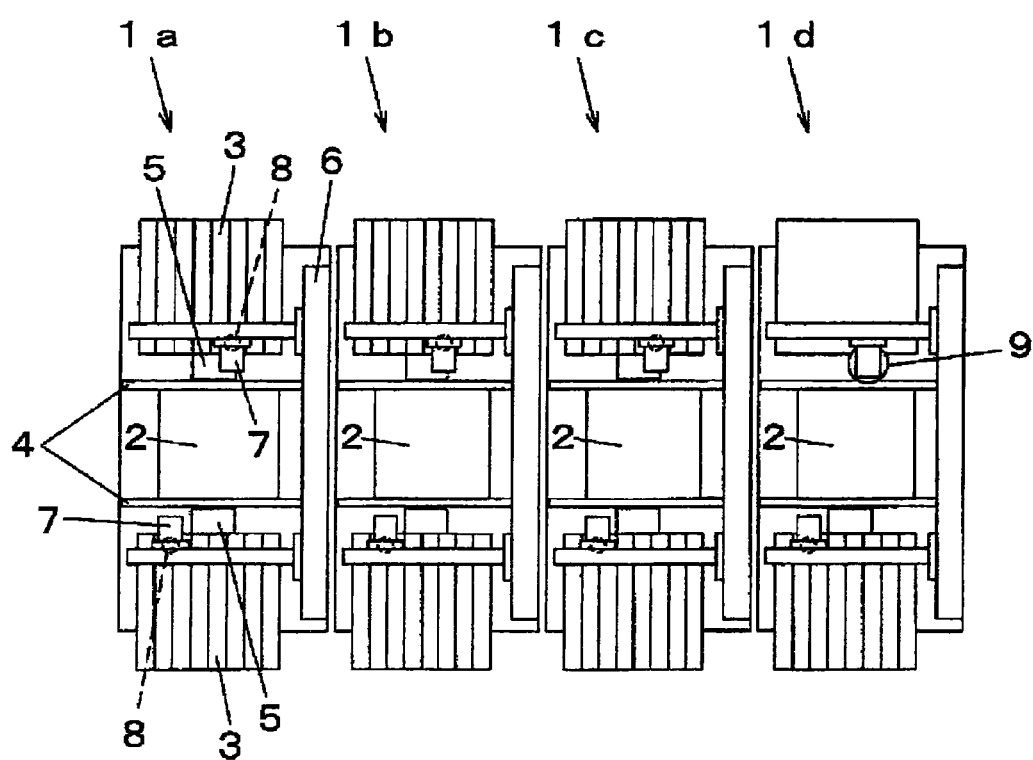
FIG. 1 is a plane view illustrating an external appearance of a mounting system according to an embodiment of the invention.

An exemplary embodiment of the invention will be described with reference to the drawings. FIG. 1 is a plane view illustrating an external appearance of a mounting system according to the embodiment of the invention. The mounting system is a system which includes plural mounting apparatus 1 and mounts components step by step while conveying a board 2 from a mounting apparatus 1a disposed on the most upstream to a mounting apparatus 1d disposed on the most downstream. Locations where the components are mounted on the board 2 are assigned in advance to the mounting apparatuses 1a to 1d. The mounting apparatuses 1a to 1d mount the components only on the assigned component mounting locations.

Each of the mounting apparatuses 1a to 1d includes a component supplying unit 3, a board conveyance mechanism 4, a component recognition unit 5, an orthogonal robot 6, a mounting head 7, and a board recognition unit 8. The board conveyance mechanism 4 of each mounting apparatus 1 can transmit and receive the board 2 with the board conveyance units 4 of the mounting apparatus 1 adjacent to each other. In addition, the board conveyance mechanism 4 has a function for positioning the board 2 on a mounting stage provided in a predetermined place.

The mounting head 7 is movable by the orthogonal robot 6 between the component supplying unit 3 and positioned board 2 and mounts a component picked up from the component supplying unit 3 to the component mounting location of the board 2. The component recognition unit 5 recognizes the presence or non-presence of the component and the posture of the component from the lower side of the mounting head 7. When the component is picked up with a normal posture, the component is mounted on the board 2. Alternatively, when the component which has to be picked up is not recognized, an error processing is performed.

The board recognition unit 8 is mounted in the orthogonal robot 6 together with the mounting head 7 and inspects a mount state of the component mounted on the board 2 by recognizing the board 2 from the upper side. Locations where the board recognition unit 8 inspects the mount state of the component are a location where the mounting apparatus mounts the component and a location where the component has been mounted by each mounting apparatus disposed on the upstream side. When the component is mounted at a predetermined location with a normal posture, the board 2 is conveyed to each mounting apparatus disposed on the downstream side. However, when the component is not present at the location where the component has to be mounted or when the component is not mounted with the normal posture, the error operation is performed.

The mounting apparatus 1d disposed on the most downstream side includes a board recognition unit 9 which has a capability higher than the board recognition units 8 provided with the mounting apparatus 1a, 1b, and 1c, and performs a final inspection operation on the mount state of all the component mounting locations of the board 2. Moreover, the board recognition unit 9 has a capability for recognizing a more area per unit time than the other board recognition units 8. However, in the invention, this capability is not necessarily required, but the board recognition unit 9 may have the same capability as that of the other board recognition units 8.

Figure 2:
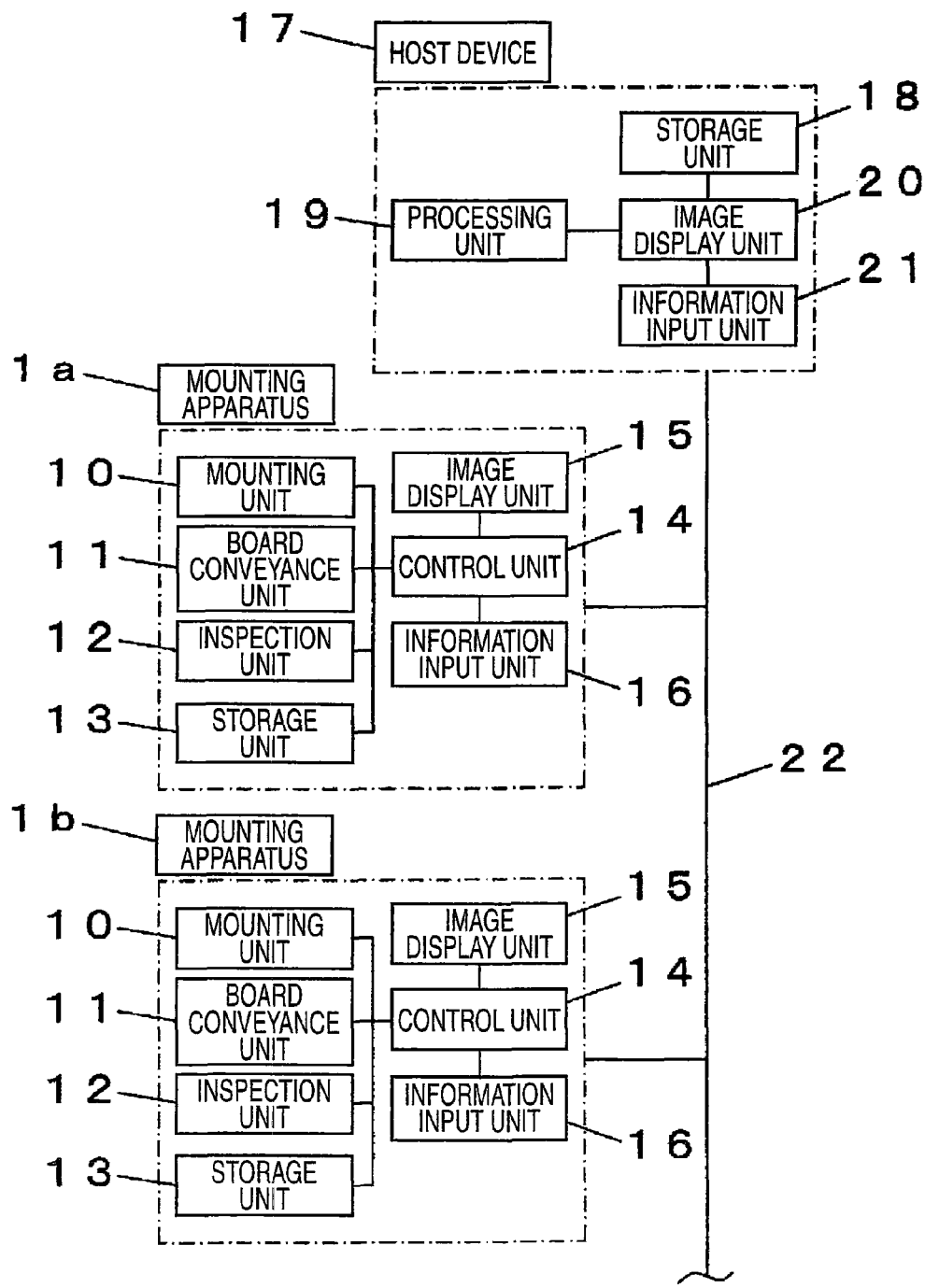
FIG. 2 is a block diagram illustrating a control configuration of the mounting system according to the embodiment of the invention.

FIG. 2 is a block diagram illustrating a control configuration of the mounting system according to the embodiment of the invention. The mounting apparatus 1a and 1b (since the mounting apparatus 1c and 1d have the same configuration, the illustration is omitted) each include a mounting unit 10, a board conveyance unit 11, an inspection unit 12, a storage unit 13, a control unit 14, an image display unit 15, and an information input unit 16. The mounting unit 10 is a driver unit which controls the drive of the component supplying unit 3, the orthogonal robot 6, and the mounting head 7. The board conveyance unit 11 is a driver unit which controls the drive of the board conveyance mechanism 4. The inspection unit 12 is a driver unit which controls the drive of the component recognition unit 5, the board recognition unit 8, and the orthogonal robot 6 and a microprocessor which analyzes and processes board recognition data.

The inspection unit 12 analyzes the board recognition data of the locations where the component are mounted in the mounting apparatuses 1a to 1d. The board recognition data is analyzed into the normal mounting when the component is mounted at a predetermined location with a normal posture. Alternatively, the board recognition data is analyzed into the abnormal mounting and the error process is performed when the component is not mounted or when the component is not mounted with the normal posture. The board 2 processed to be normal is conveyed to the next (downstream) mounting apparatus to continue to again mount a component. Alternatively, the board 2 processed to be abnormal is deviated from a conveyance line, so that an operator examines the abnormal location or an occurrence cause.

The storage unit 13 is a memory which stores data about the board 2, the component, coordinate data indicating the component mounting location, various parameters, and the like and stores base data or a control parameter in advance when the mounting unit 10, the board conveyance unit 11, and the inspection unit 12 are controlled.

The image display unit 15 is a display unit which visually displays the board recognition data analyzed by the inspection unit 12. Based on displayed image information, the operator can determine whether the mount state is normal or not. Moreover, according to a manual manipulation from the information input unit 16, the operator can select the normal mounting process or the error process. The displayed image information can be stored in the storage unit 13 to use follow-up investigation or statistical management.

A host device 17 includes a storage unit 18, a processing unit 19, an image display unit 20, and an information input unit 21, and generally manages the mounting apparatus 1 interconnected to each other through a bus 22. The processing unit 19 manages all data about the abnormal mounting of the mounting system by integrating the analysis process result of the inspect unit 12 of each mounting unit 1, statistically processing details or tendency of the abnormal mounting, and performing other operations. The analysis processing work performed by the inspect unit 12 of each mounting apparatus 1 can be integrally performed by the processing unit 19. In this case, the same images as those displayed on the display unit 15 of the mounting apparatus 1a to 1d are displayed on the image display unit 20. The operator who has determined whether the components are normally mounted on the basis of the displayed image information can perform a manual manipulation through the information input unit 21 to select the normal mounting process or the error process. The displayed images can be stored in the storage unit 18 to use the follow-up investigation or the statistical management.

FIG. 3 is a top view illustrating a relationship between a component mounting location and a board recognition location in each mounting apparatus. In this embodiment, a model in which the board 2 is divided into four divisions a to d assigned to the mounting apparatus will be described. However, not only the board divided in this simple manner is used in a real production, but also a board divided in a random manner is used. The invention can be applied to such a board.

The division illustrated by oblique lines on the board 2 shown in the upper part of FIG. 3 is a location where the component is mounted in each mounting apparatus. The division illustrated by oblique lines on the board 2 the lower part of FIG. 3 is a location where the board state is recognized in each mounting apparatus. In the mounting system according to this embodiment, the mount state of the components mounted on the board is inspected by a method including a step of inspecting the mount state of the component at the location where the component is mounted by each mounting apparatus in each mounting apparatus, and a step of inspecting the mount state at the location where the component has been mounted by each mounting apparatus disposed on the upstream side in each mounting apparatus disposed on the downstream side. In this way, it is possible to specify the mounting apparatus having performed various operations which cause the normality.

The mounting apparatus 1a mounts components at locations included in the division a, and recognizes the board state within the division a likewise. In this step, when one component is processed to be abnormal, the abnormal occurrence location is one of the component mounting locations included in the division a where the mounting apparatus 1a mounts the components. Accordingly, it is possible to determine that the abnormal mounting has occurred due to the various operations included in the mounting operation in the mounting apparatus 1a.

The locations where the mounting apparatus 1b mounts components are just locations included in the division b, but the divisions where the board recognizing is performed are the division b where the components are mounted and the division a where the mounting apparatus 1a has mounted the components. In this step, when some components are processed to be abnormal, the abnormal occurrence location is one or both of the component mounting locations included in the division b where the mounting apparatus 1b mounts the components and the component mounting locations included in the division a where the mounting apparatus 1a disposed on the upstream side has mounted the components. Accordingly, it is possible to determine that the abnormal mounting has occurred due to the various operations included in the mounting operation in the mounting apparatus 1b. In this case, when the abnormal occurrence location is included in the division a and the abnormal mounting has occurred in the mounting apparatus 1a due to the various operations, this process should have been treated as the abnormal mounting before the board is conveyed to the mounting apparatus 1b. Therefore, it is possible to determine that the abnormal mounting has occurred due to various operations not in the mounting apparatus 1a disposed on the upstream side, where the components have been mounted, but in the mounting apparatus 1b disposed on the downstream.

Likewise, the locations where the mounting apparatus 1c mounts components are just locations included in the division c, but the divisions where the board recognizing is performed are the division c where the components are mounted and the divisions a and b where the mounting apparatus 1a and 1b have mounted the components. In this step, when some components are processed to be abnormal, the abnormal occurrence locations can be several locations of the component mounting locations included in the division c where the mounting apparatus 1c mounts the components and the component mounting locations included in the divisions a and b where the mounting apparatus 1a and 1b disposed on the upstream side have mounted the components. However, it is possible to determine that the abnormal mounting has occurred due to various operations in the mounting apparatus 1c disposed on the downstream.

The board recognition unit 9 which is provided with the mounting apparatus 1d finally inspects the mount state of all the component mounting locations on the board 2. In this step, when some components are processed to be abnormal, the abnormal occurrence locations can be several locations of the component mounting locations included in the division d where the mounting apparatus 1d mounts the components and the component mounting locations included in the divisions a, b, and c where the mounting apparatus 1a, 1b, and 1c disposed on the upstream side have mounted the components. However, it is possible to determine that the abnormal mounting has occurred due to various operations in the mounting apparatus 1d disposed on the downstream.

In this way, in the mounting system according to the invention, it is easy to specify s step in which the abnormal mounting occurs in a mounting system. Accordingly, when a cause of the abnormal mounting is solved in production, an effective solution to the cause of the abnormal mounting can be established in not the entire system but the specified step in production.

In the inspecting method described above, the mount state is inspected at all the locations where each mounting apparatus disposed on the upstream side mounts the components. However, the mount state may not be inspected at all the locations. The mount state may be inspected at the location where each mounting apparatus disposed on the downstream side mounts the components and locations adjacent the location among all the locations where the components are mounted. That is because operations of the mounting head 7 in each mounting apparatus disposed on the downstream at the time of mounting the components, for example, contacting with a nozzle (not shown) and blown wind pressure have a bad effect on the components, so that the components are easily detached, damaged, or displaced. In this way, since the inspecting is performed to the extent that the inspecting does not have the bad effect on the components, time required to perform the inspecting can be reduced.

For example, when a small component or a high component which can easily be affected badly is mounted, a location where the component is mounted can be specified in advance. In addition, the mount state of the component at a predetermined location can be thoroughly inspected not in the mounting apparatus which mounts the component at the predetermined location, but in the mounting apparatus disposed on the downstream side. If there is a location where the abnormal mounting frequently occurs during the mounting process of the mounting system, the location can be set as the specific location, thereby improving inspection reliability.

According to the inspecting method, a location or an item where the abnormal mounting occurs can be narrowed in an order of an apparatus, a mounting head, and a nozzle with reference to a mounting program. Accordingly, when the cause of the abnormal mounting is solved in production, the effective solution to the cause of the abnormal mounting can be established in not the entire system but the specified location or item. Therefore, it is possible to reduce degrading of productivity by solving the cause of the abnormality more easily and earlier.

Industrial Applicability

The invention is particularly effective when a cause of abnormal mounting is specified in a mounting system capable of mounting components step by step on a board conveyed via plural mounting apparatus.

The invention claimed is:

1. A method of inspecting a mount state of components mounted by a plurality of mounting apparatuses on a board which is conveyed from an upstream side to a downstream side, the method comprising:
   inspecting a mount state of components every time when each mounting apparatus of the plurality of the mounting apparatuses mounts the components to make a judgment of whether the components mounted by said each mounting apparatus are correctly mounted or not, wherein said each mounting apparatus further inspects a mount state of components mounted by one or more upstream mounting apparatuses disposed on the upstream side of said each mounting apparatus to make a judgment of whether the components mounted by said one or more upstream mounting apparatuses are correctly mounted or not.

2. The method according to claim 1, further comprising inspecting the mount state of components located adjacent to the components mounted by said each mounting apparatus, among the components mounted by said one or more upstream component mounting apparatuses.

3. The method according to claim 2, further comprising inspecting the mount state of components located at a predetermined location among the components mounted by said one or more upstream component mounting apparatuses.

4. The method according to claim 1, further comprising inspecting the mount state of components located at a predetermined location among the components mounted by said one or more upstream component mounting apparatuses.

5. A method of inspecting a mount state of components mounted by a plurality of mounting apparatuses on a board which is conveyed from an upstream side to a downstream side, the method comprising:

inspecting a mount state of components every time when each mounting apparatus of the plurality of the mounting apparatuses mounts the components, wherein said each mounting apparatus further inspects a mount state of components mounted by one or more upstream mounting apparatuses disposed on the upstream side of said each mounting apparatus to make a determination of whether an abnormal mounting is caused by said each mounting apparatus or any of said one or more upstream mounting apparatuses.

6. The method according to claim 5, further comprising inspecting the mount state of components located adjacent to the components mounted by said each mounting apparatus, among the components mounted by said one or more upstream component mounting apparatuses.

7. The method according to claim 5, further comprising inspecting the mount state of components located at a predetermined location among the components mounted by said one or more upstream component mounting apparatuses.

8. The method according to claim 6, further comprising inspecting the mount state of components located at a predetermined location among the components mounted by said one or more upstream component mounting apparatuses.

* * * * *